United States Patent
Liu et al.

(10) Patent No.: US 11,513,142 B2
(45) Date of Patent: Nov. 29, 2022

(54) LIVE DETECTION METHOD AND APPARATUS FOR A HIGH-VOLTAGE SWITCH CABINET

(71) Applicants: STATE GRID JIANGXI ELECTRIC POWER COMPANY LIMITED RESEARCH INSTITUTE, Jiangxi (CN); STATE GRID CORPORATION OF CHINA, Beijing (CN); NANCHANG KECHEN ELECTRIC POWER TEST AND RESEARCH CO., LTD, Jiangxi (CN)

(72) Inventors: Yuting Liu, Jiangxi (CN); Peng Wang, Jiangxi (CN); Qiukuan Zhou, Jiangxi (CN); Mingjun Liu, Jiangxi (CN); Tangbing Li, Jiangxi (CN); Chao Tong, Jiangxi (CN); Yu Zhang, Jiangxi (CN); Junxin Tong, Jiangxi (CN); Yan Liu, Jiangxi (CN); Tian Chen, Jiangxi (CN); Yang Zou, Jiangxi (CN)

(73) Assignee: STATE GRID JIANGXI ELECTRIC POWER COMPANY LIMITED RESEARCH INSTITUTE

(*) Notice: Subject to any disclaimer, the term of this patent is extended or adjusted under 35 U.S.C. 154(b) by 1023 days.

(21) Appl. No.: 16/306,270

(22) PCT Filed: Jan. 15, 2018

(86) PCT No.: PCT/CN2018/072631
§ 371 (c)(1),
(2) Date: Nov. 30, 2018

(87) PCT Pub. No.: WO2019/015278
PCT Pub. Date: Jan. 24, 2019

(65) Prior Publication Data
US 2021/0223297 A1  Jul. 22, 2021

(30) Foreign Application Priority Data

Jul. 20, 2017 (CN) .......................... 201710597613.1

(51) Int. Cl.
*G01R 19/155* (2006.01)
*G01C 21/20* (2006.01)
(Continued)

(52) U.S. Cl.
CPC .......... *G01R 19/155* (2013.01); *B25J 9/1664* (2013.01); *B25J 9/1697* (2013.01); *G01C 21/206* (2013.01); *H04W 84/12* (2013.01)

(58) Field of Classification Search
CPC ..... B25J 9/1664; B25J 9/1697; G01C 21/206; G01J 5/0096; G01J 5/00; G01R 19/155;
(Continued)

(56) References Cited

U.S. PATENT DOCUMENTS 9,500,377 B2 * 11/2016 Viswanathan ......... G05B 15/02

FOREIGN PATENT DOCUMENTS

| CN | 203490564 | 3/2014 |
|---|---|---|
| CN | 104881031 | 9/2015 |

(Continued)

*Primary Examiner* — Judy Nguyen
*Assistant Examiner* — Martin Walter Braunlich
(74) *Attorney, Agent, or Firm* — McDonald Hopkins LLC

(57) ABSTRACT

Provided are a live detection method and apparatus for a high-voltage switch cabinet. The live detection apparatus for a high-voltage switch cabinet includes a robot body and a back-end server. The robot body includes a host module, a power module, a detection module and a motion module. The power module is electrically connected to the host module and the motion module. The host module is communicably connected to the motion module and the detection module. The detection module includes a visible light camera, an infrared thermal imager, an non-contacting ultra-
(Continued)

sonic sensor and an ultrahigh-frequency sensor. The motion module includes a horizontal motion module, a vertical motion module and a rotating motion module. The horizontal motion module includes a motor-driven carrier and a laser navigation system. The vertical motion module is secured to the motor-driven carrier.

11 Claims, 5 Drawing Sheets

(51) Int. Cl.
*B25J 9/16* (2006.01)
*H04W 84/12* (2009.01)

(58) Field of Classification Search
CPC .......... G01R 31/1209; G01R 31/1227; H04W 84/12; H04W 84/10
See application file for complete search history.

(56) References Cited

FOREIGN PATENT DOCUMENTS

| | | | |
|---|---|---|---|
| CN | 105259899 | | 1/2016 |
| CN | 105698807 | | 6/2016 |
| CN | 105698807 A | * | 6/2016 |
| CN | 106291278 | | 1/2017 |
| CN | 106443387 | | 2/2017 |
| CN | 106443387 A | * | 2/2017 |
| CN | 106501690 A | * | 3/2017 |
| CN | 107367672 | | 11/2017 |
| CN | 108362983 A | * | 8/2018 |
| JP | 4992397 | | 8/2012 |

* cited by examiner

LIVE DETECTION METHOD AND APPARATUS FOR A HIGH-VOLTAGE SWITCH CABINET

CROSS-REFERENCE TO RELATED APPLICATION

This application is a 35 U.S.C. 371 national stage filing of PCT Application No. PCT/CN2018/072631 filed on Jan. 15, 2018, which claims priority to Chinese Patent Application No. 201710597613.1 filed on Jul. 20, 2017, each of which are incorporated herein in their entirety by reference.

TECHNICAL FIELD

The present application relates to the technical field of high-voltage electrical equipment, for example, a live detection method and apparatus for a high-voltage switch cabinet.

BACKGROUND

High-voltage switch cabinets are used for directly supplying power to users, but most power consumer lines are difficult to configure according to the N-1 reliability principle as is done for power transmission lines. The reliability of switch cabinet directly determines the reliability of power supply to users. The large quantity and low manufacturing costs of high-voltage switch cabinets and the high costs of monitoring equipment make it impossible for switch cabinets to use an on-line monitoring apparatus which is used for monitoring a transformer or a Gas Insulated Switch cabinet (GIS) to achieve comprehensive and real-time on-line monitoring.

According to China Electric Power Research Institute's research on types of failures that switch equipment with voltage classes below 40.5 kV underwent from 1989 to 1997 and in 2004, insulation and current-carrying failures (including obstacles) account for 30%-53%. Jiangxi Electric Power Corporation's statistical result of types of failures that switch cabinets underwent from 2010 to 2015 shows that the proportion of insulation and current-carrying failures is as high as 53%.

Insulation and current-carrying failures are characterized by partial discharge or heating in the beginning. Therefore, the partial discharge detection and infrared thermographic detection of switch cabinets have an important and positive effect on reducing the fault rate of the switch cabinets. Live detection of a switch cabinet is performed according to different detection items by an operator carrying a partial discharge live detector and an infrared thermographic detector. This involves a large amount of detection work and takes a long time.

SUMMARY

The present application provides a live detection method and apparatus for a high-voltage switch cabinet, achieving the automatic detection and intelligent diagnosis of the partial discharge and infrared thermal images of the high-voltage switch cabinet.

The present application provides a live detection apparatus for a high-voltage switch cabinet. The live detection apparatus includes a robot body. The robot body includes a host module, a power module, a detection module and a motion module. The power module is electrically connected to the host module and the motion module, and the host module is communicably connected to the motion module and the detection module. The detection module includes a visible light camera, an infrared thermal imager, a non-contacting ultrasonic sensor and an ultrahigh-frequency sensor.

Optionally, the motion module includes a horizontal motion module, a vertical motion module and a rotating motion module.

Optionally, the horizontal motion module includes a motor-driven carrier and a laser navigation system. The vertical motion module is secured to the motor-driven carrier, the rotating motion module is secured to the vertical motion module, and the detection module is secured to the rotating motion module.

Optionally, the motor-driven carrier includes two main front driving wheels, two main rear driving wheels, a drive motor, a drive gear and a rack. The two main front driving wheels, the two main rear driving wheels, the drive motor and the drive gear are secured to the rack.

Optionally, the host module is secured to the rack of the motor-driven carrier and includes a WIFI communication module, an image processing module, a partial discharge signal processing module, a motion control system and a data acquisition system. The motion control system is communicably connected to the motion module and the detection module, and the data acquisition system is communicably connected to the detection module.

Optionally, the live detection apparatus for high-voltage switch cabinet further includes an in-station controlling terminal, a remote controlling terminal, a mobile inquiry terminal and a back-end server. The remote controlling terminal is connected to the in-station controlling terminal via an optical fiber, and the mobile inquiry terminal is remotely and wirelessly connected to the in-station controlling terminal in 4G communication manner.

The present application further provides a live detection method for a high-voltage switch cabinet which is implemented based on the live detection apparatus for a high-voltage switch cabinet. The method includes the steps described below.

In step 1, a detection path is planned.

In step 2, a task package is created according to a layout of switch cabinets.

In step 3, alignment is performed for detection. At the beginning of detection, an operator clicks "one-click detection" on a remote computer. The robot body of the live detection apparatus for a high-voltage switch cabinet starts moves out from a charging dock and moves along the detection path. When the robot body arrives at a preset detection position of a first switch cabinet, the robot body stops moving and adjusts a carrier body and an angle of a detection system to enable a front end of the carrier body and the detection system to face the switch cabinet;

In step 4, an infrared detection is performed. The cabinet door of the switch cabinet is divided into an upper section A and a lower section B. The infrared thermal imager is automatically turned on and aimed at the cabinet door horizontally, and a thermal image of the section A is taken by the infrared thermal imager. The detection module rotates vertically so that the infrared thermal imager is at an angle of 45 degrees with respect to a horizontal plane, a thermal image of the section B is taken, and then the detection module is rotated back to a horizontal angle, and the infrared detection of the switch cabinet is finished.

In step 5, a partial discharge detection is performed. The robot body of the live detection apparatus for a high-voltage switch cabinet gets close to the cabinet door of the switch cabinet, the robot body stops moving when a laser radar in the laser navigation system detects that the door is 20 centimeters ahead. The vertical motion module is started to raise the detection module at a constant speed, the visible light camera is turned on to perform second detection and feature extraction of the switch cabinet, and the detection module stops moving after detecting a door interstice of the switch cabinet. The ultrahigh-frequency sensor and the non-contacting are aimed at the door interstice to perform partial discharge detection. The detection module is further raised to detect a next door interstice. After the detection is completed, the detection module is lowered to an original position and the partial discharge detection of the switch cabinet is completed.

In step 6, the robot body of the live detection apparatus for a high-voltage switch cabinet returns to the detection path, and moves to a next switch cabinet according to the marked positions of the switch cabinets on the map and detects the next switch cabinet. The robot body automatically returns to the charging dock after all switch cabinets have been detected.

Optionally, in step 1, the robot body of the live detection apparatus for a high-voltage switch cabinet automatically traverses the whole work environment, creates the two-dimensional map using the laser navigation system simultaneously, and stores the two-dimensional map in the back-end server after the creation. The operator calls out the two-dimensional map on a remote computer and plans the detection path. The robot body moves according to the planned detection path, detects obstacles in real time while moving, and, bypasses the obstacles and returns to the planned path.

Optionally, in step 2, the operator creates a task package according to the layout of the switch cabinets. The robot body of the live detection apparatus for a high-voltage switch cabinet downloads the task package from the server before detection, processes the two-dimensional map according to the layout of switch cabinets to mark the positions of switch cabinets and the serial numbers of the cabinet doors on the two-dimensional map.

Optionally, the robot body of the live detection apparatus for a high-voltage switch cabinet sends the thermal image and the partial discharge detection pattern to the back-end server in real time. The infrared detection result and an original thermal image are compared, and if an abnormal temperature rise is detected in an area, the robot body continues to detect a next area until no abnormal temperature rise is detected in the detection area.

Optionally, the partial discharge detection pattern is compared with an original pattern, and if the partial discharge detection pattern of the non-contacting ultrasonic sensor or the ultrahigh-frequency sensor shows that an abnormal discharge signal in one interstice, the robot body proceeds to detect a next interstice until no abnormal discharge signal is detected by both the non-contacting ultrasonic sensor and the ultrahigh-frequency sensor.

Optionally, the robot body of the live detection apparatus for a high-voltage switch cabinet pauses the detection and raises an alarm through the back end server once the suspected heating defect area or the suspected discharge defect area is detected. Upon receiving the alarm, the operator remotely examines the detection pattern, makes a judgment, and determines whether to redetect the suspected defect areas or proceeds to the detection of a next switch cabinet.

With the embodiments of the present application, the partial discharge and infrared thermal images of the high-voltage switch cabinet are the automatically detected, and the state of the high-voltage switch cabinet is monitored in real time. Further, the partial discharge and infrared thermal images of the high-voltage switch cabinet in a high-pressure chamber of a transformer substation may be detected without requiring the operator to be on site, greatly reducing the labor cost of live detection.

DETAILED DESCRIPTION

The present application will be further described in detail with reference to the accompanying drawings.

Figure 1:
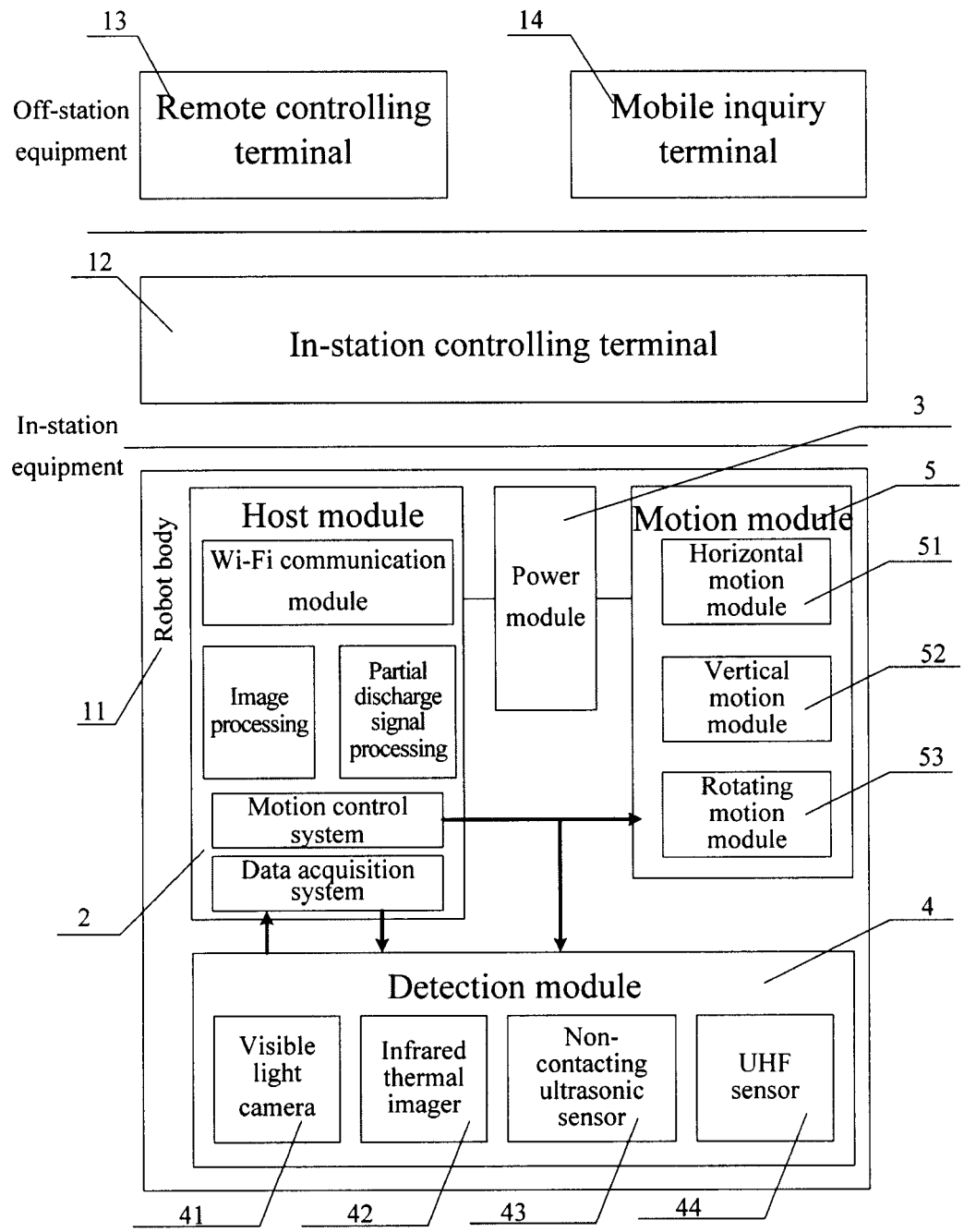
FIG. 1 is a block diagram illustrating a structure of a live detection apparatus for a high-voltage switch cabinet according to an embodiment of the present application.

As shown in FIG. 1, a live detection apparatus for a high-voltage switch cabinet includes a robot body 11. The robot body 11 includes a host module 2, a power module 3, a detection module 4 and a motion module 5. The power module 3 is electrically connected to the host module 2 and the motion module 5, and the host module 2 is communicably connected to the motion module 5 and the detection module 4. The detection module 4 includes a visible light camera 41, an infrared thermal imager 42, a non-contacting ultrasonic sensor 43 and an ultrahigh-frequency sensor 44.

Figure 2:
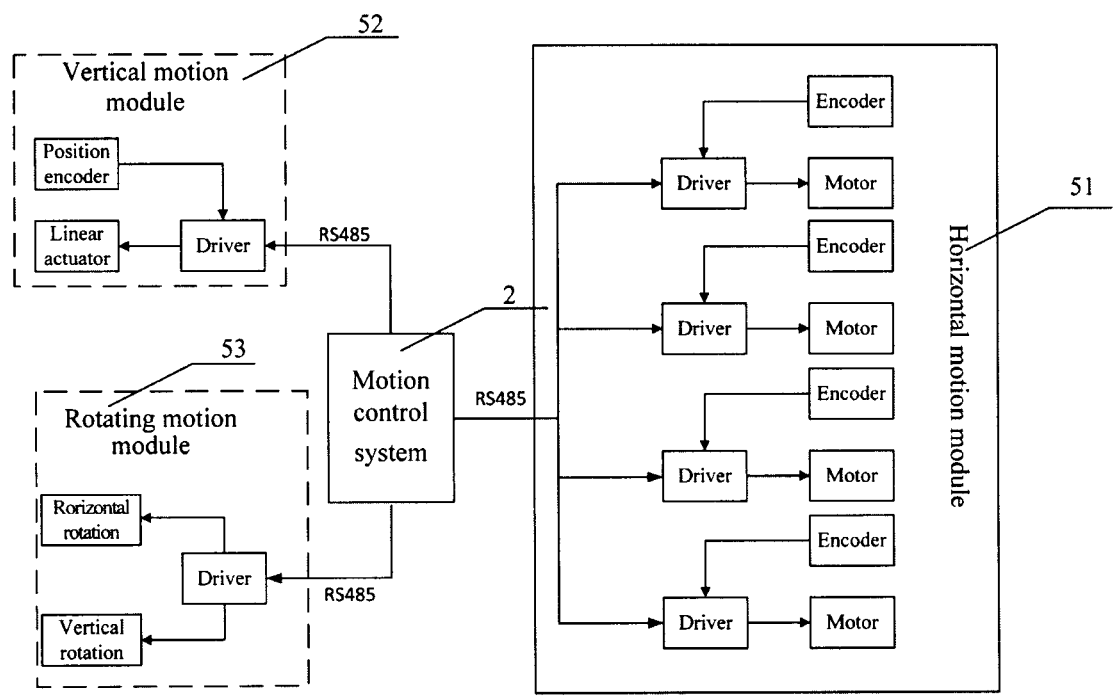
FIG. 2 is a block diagram illustrating a structure of a motion module of a robot body according to an embodiment of the present application.
Figure 3:
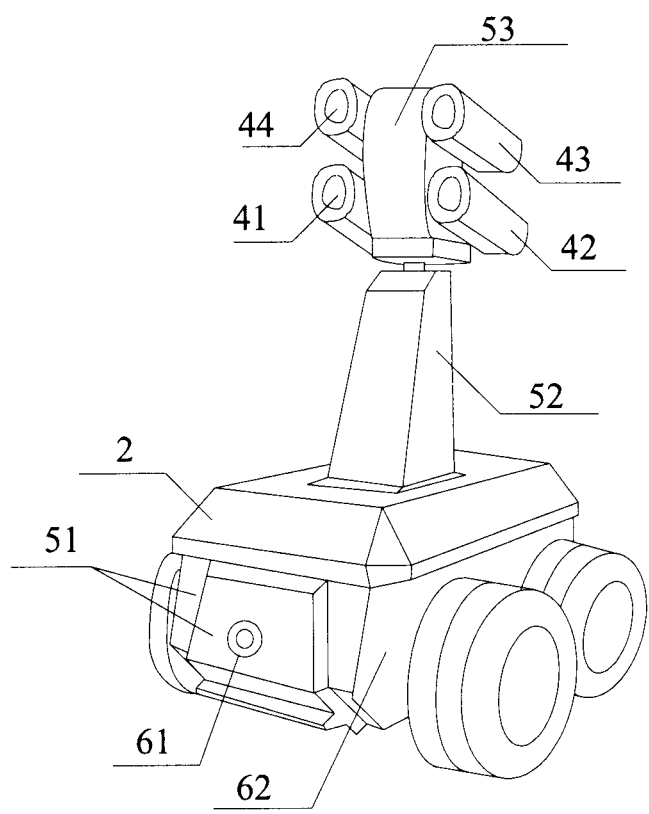
FIG. 3 is a perspective view of a robot body according to an embodiment of the present application.
Figure 4:
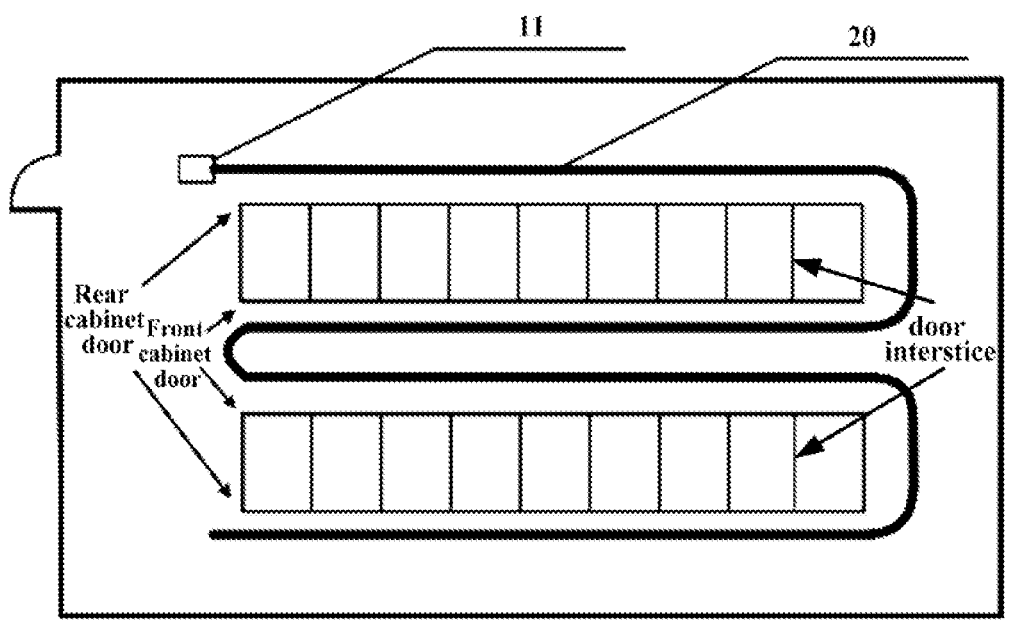
FIG. 4 is a schematic diagram illustrating a live detection path of a high-voltage switch cabinet according to an embodiment of the present application.

Optionally, as shown in FIG. 2, the motion module 5 includes a horizontal motion module 51, a vertical motion module 52 and a rotating motion module 53. The horizontal motion module 51, vertical motion module 52 and rotating motion module 53 are all communicably connected to a motion control system of the host module 2. As shown in FIG. 3, the horizontal motion module 51 includes a motor-driven carrier 62 and a laser navigation system 61. The vertical motion module 52 is secured to the motor-driven carrier 62, and can adjust the height of the detection module 4 within a range of 50 cm~150 cm from the ground. The rotating motion module 53 is secured to the vertical motion module 52 and can adjust the detection module 4 by a horizontal rotation angle of 0~360° and by a vertical rotation angle of −60°~60°. The visible light camera 41, the infrared thermal image 42, the non-contacting ultrasonic sensor 43 and the ultrahigh-frequency sensor 44 are secured to the rotating motion module 53. The laser navigation system 61 is secured to a front end of the motor-driven carrier 62, adopts indoor laser radar, that is, the Simultaneous Localization and Mapping (SLAM) navigation technology. The laser navigation system 61 includes a two-dimensional laser radar URG-04LX 2D of the HOKUYO company and is arranged in the front of the lower part of the robot body 11.

Optionally, the visible light camera 41 adopts a 1/2.8" progressive-scan Complementary Metal Oxide Semiconductor (CMOS) sensor, and has a focal length of 4.5 mm~135 mm and an optical zoom factor of 30×. The infrared thermal imager 42 adopts an uncooled focal plane array microbolometer, and has a wavelength range of 8 um~14 um. The non-contacting ultrasonic sensor 43 adopts an ultrasonic partial discharge detector provided by Physical Acoustics Corporation (PAC), has a detection frequency band of 20 kHz~80 kHz and is provided with a wave focusing device. The ultrahigh-frequency sensor 44 adopts a multiple-arm helical antenna, has a detection frequency band of 300 MHz~1500 MHz and possesses a function of directional reception.

Optionally, the motor-driven carrier 62 includes two main front driving wheels, two main rear driving wheels, a DC brushless servo motor, a drive gear and a rack. The two main front driving wheels, the two main rear driving wheels, the DC brushless servo motor and the drive gear are secured to the rack.

Optionally, the host module 2 is secured to the rack of the motor-driven carrier and includes a Wi-Fi communication module, an image processing module, a partial discharge signal processing module, a motion control system and a data acquisition system. The Wi-Fi communication module adopts an RT3070L module. The image processing module adopts an i.MX6Q core board and performs image compression and encoding in a JPEG format. The partial discharge signal processing module adopts a Digital Signal Processing (DSP) module as the main control part of the system, and includes a DSP chip and its peripheral extension chip. TMS320C6173B DSP of Texas Instruments (TI) is selected as the main control chip, and K4H5 chips of Samsung are used as Synchronous Dynamic Random Access Memory (SDRAM). The data acquisition system includes two parts: one is the Complex Programmable Logic Device (CPLD) and the other includes a discharge signal analog to digital convertor, an envelope detector and a video signal analog to digital convertor. AD7490 chips of Analog Devices Incorporation (ADI) are used as the analog to digital convertor for the discharge signal and the analog to digital convertor for the video signal. The motion control system adopts an STM32F405 RGT6 enhanced micro-controller as a control unit, and adopts an TMS320LF2407A DSP chip and a drive circuit as a motor drive controller. The motion control system is communicably connected to the motion module 5 and the detection module 4, and the data acquisition system is communicably connected to the detection module. The host module 2 and the in-station controlling terminal 12 communicate with each other by Wi-Fi.

As shown in FIG. 2, the motion module 5 is controlled by the motion control system through an RS485 bus, and the horizontal motion module 51 includes a motor-driven carrier 62 and a laser navigation system 61. The motor-driven carrier 62 is equipped with a drive unit that includes a servo driver, a drive motor and an encoder to control the robot body to move, the servo driver is connected to the drive motor, and the encoder is arranged on the drive motor.

Optionally, the vertical motion module 52 includes a linear actuator, a driver, a position encoder and a stopper. The vertical motion module 52 is secured to the rack of the motor-driven carrier 62 and is electrically connected to the host module 2. The vertical motion module 52 includes a lifting rod, an air pump, an air cylinder, a coiling mechanism and a positioning mechanism, and an adjustable height range of the vertical motion module is 50 cm~150 cm from the ground.

Optionally, the rotating motion module 53 is a two-degree-of-freedom cradle head, is secured to the lifting rod of the vertical motion module 52 and is electrically connected to the host module 2. The rotating motion module 53 includes a drive motor, a rotating shaft and a circumferential positioning mechanism, and has a horizontal rotation angle of 0~360° and a vertical rotation angle of −60°~60°.

As shown in FIG. 1, the live detection apparatus for a high-voltage switch cabinet also includes an in-station controlling terminal 12, a remote controlling terminal 13 and a mobile inquiry terminal 14. The in-station controlling terminal 12 is used for controlling the motion trail of the robot body 11, automatic detection, data processing, data communication, and data analysis and diagnosis of live detection. The remote controlling terminal 13 receives field detection data uploaded by the in-station controlling terminal 12 and performs centralized monitoring and alarm. The mobile inquiry terminal 14 is used for inquiring field detection data of the switch cabinet. The remote controlling terminal 13 is connected to the in-station controlling terminal 12 via an optical fiber. The mobile inquiry terminal 14 is remotely and wirelessly connected to the in-station controlling terminal 12 via 4G communication.

In a new environment, the robot body needs to automatically traverse the whole work environment and creates a two-dimensional map using the laser navigation system simultaneously, and stores the two-dimensional map to a back-end server after the two-dimensional map is created. The operator gets the two-dimensional map on a remote computer and plans the detection path 20 on the two-dimensional map, and the robot body moves according to the planned detection path 20, detects obstacles in real time while moving, and goes around the obstacles and returns to the planned path.

The operator creates a task package according to the layout of switch cabinets. Before the detection, the robot body downloads the task package from the back-end server. The robot body processes the created two-dimensional map and marks positions of the switch cabinets and serial numbers of cabinet doors of the switch cabinets.

The robot body of the live detection apparatus for a high-voltage switch cabinet stays at a charge dock of the live detection apparatus when the robot body is not at work. At the beginning of the detection work, the operator clicks "one-click detection" on a remote computer. Here, the "one-click detection" may be a virtual button on the interface of the computer. When the operator clicks the virtual button, the live detection apparatus for a high-voltage switch cabinet is started to perform detection. The robot body of the live detection apparatus for a high-voltage switch cabinet starts off from the charging dock and moves along the detection path. When the robot body arrives at a preset detection position of a first switch cabinet, the robot body stops moving and adjusts a carrier body and an angle of a detection system to enable a front end of the carrier body and the detection system to face the switch cabinet.

Infrared detection is described below. The cabinet door of the switch cabinet is divided into an upper section A and a lower section B. The infrared thermal imager 42 is automatically turned on and aimed at the cabinet door horizontally, and takes a thermal image of the section A. The detection module 4 rotates vertically so that the infrared thermal imager 42 is aimed at an angle of 45 degrees with respect to a horizontal plane, and takes a thermal image of the section B, and then the detection module rotates back to a horizontal angle, and the infrared detection of the switch cabinet is finished.

Partial discharge detection is described below. The robot body moves to the cabinet door of the switch cabinet and stops moving when the laser radar in the laser navigation system detects that the cabinet door is ahead in a preset distance. Optionally, the preset distance is 20 cm. The vertical motion module 52 is activated to raise the detection module 4 at a constant speed, the visible light camera 41 is turned on to perform a second detection and feature extraction on the switch cabinet, and the detection module stops moving upon detecting a door interstice of the switch cabinet. The ultrahigh-frequency sensor 44 and the non-contacting ultrasonic sensor 43 are aimed at the door interstice to perform partial discharge detection. The detection module 4 is further raised to detect a next door interstice. After the detection is completed, the detection module 4 is lowered to an original position, and the partial discharge detection of this switch cabinet is finished.

The robot body of the live detection apparatus for a high-voltage switch cabinet returns to the detection path 20 and moves to a next switch cabinet according to a marked positions of switch cabinets on the map. The robot body automatically returns to the charging dock after all the switch cabinets have been detected.

Figure 5:
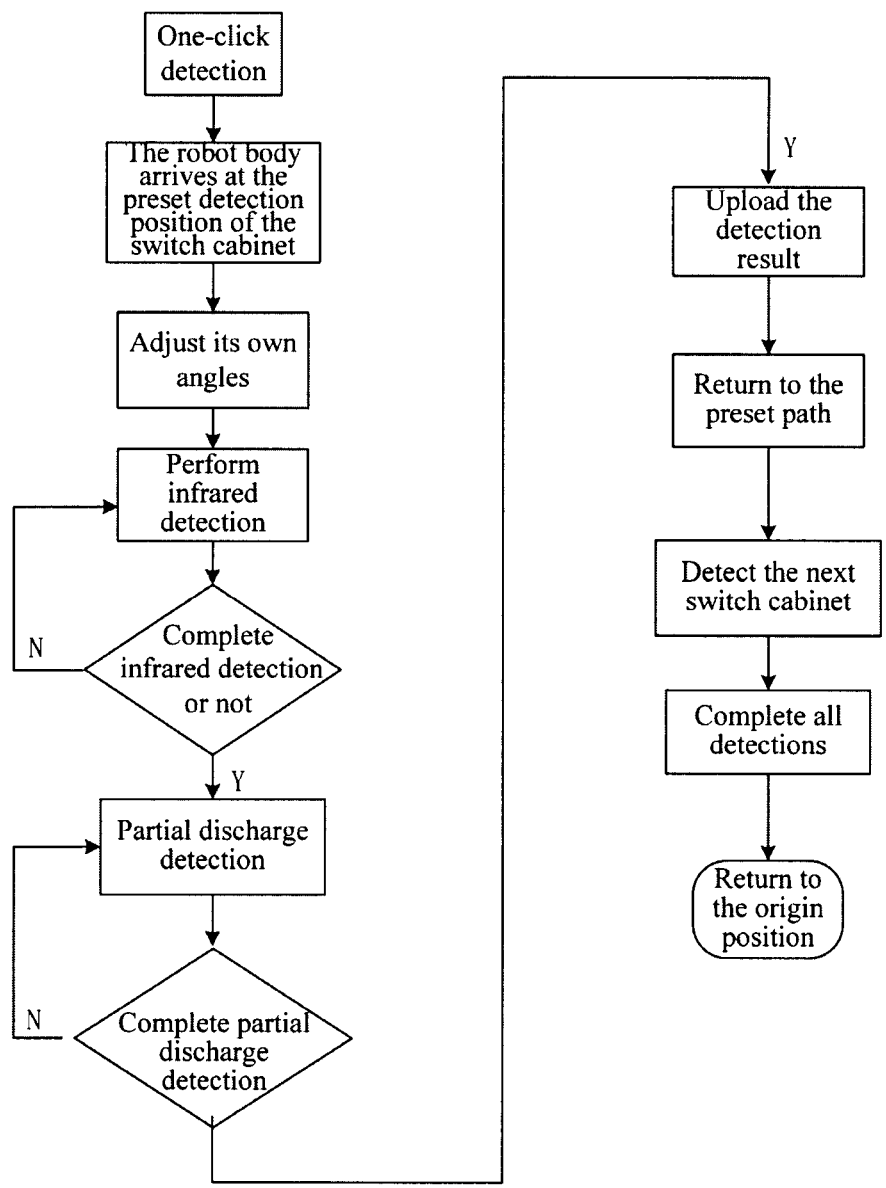
FIG. 5 is a flowchart of a live detection method for a high-voltage switch cabinet according to an embodiment of the present application.

The robot body of the live detection apparatus for a high-voltage switch cabinet sends the thermal image and the partial discharge detection pattern to the back-end server in real time. The thermal image obtained in real time and the original thermal are compared. If an abnormal temperature rise is detected in an area, the robot body continues to detect a next area until no abnormal temperature rise is detected in the detection area. For instance, if the abnormal temperature rise is detected from the section A of #1 switch cabinet to the section B of #3 switch cabinet (T≠0), then the temperature rise number set of the heating area T$\{T_1, T_2, T_3, T_4, T_5, T_6\}$ is obtained, as shown in FIG. 5. The area that has the maximal temperature rise $T_{MAX}$ is automatically determined as the suspected heating defect area according to a horizontal comparison method.

The partial discharge detection pattern and the original pattern are compared. If the partial discharge detection pattern of the non-contacting ultrasonic sensor 43 or the ultrahigh-frequency sensor 44 shows that an abnormal discharge signal exists in an interstice, the robot body continues to detect a next interstice until no abnormal discharge signal is detected by both the non-contacting ultrasonic sensor and the ultrahigh-frequency sensor. For instance, ultrasonic partial discharge Q1 and ultrahigh-frequency partial discharge Q' (Q1+Q'≠0) are detected from the interstice 1 of #1 switch cabinet to the interstice 2 of #3 switch cabinet, and the ultrasonic signal amplitude number set Q$\{Q_1, Q_2, Q_3, Q_4, Q_5, Q_6\}$ and the ultrahigh-frequency signal peak number set Q'$\{Q'_1, Q'_2, Q'_3, Q'_4, Q'_5, Q'_6\}$ are obtained. According to the horizontal comparison method, if $Q_{MAX}$ and $Q'_{MAX}$ are partial discharges of the same interstice, the $Q_{MAX}/Q'_{MAX}$ interstice area is automatically determined as the suspected discharge defect area. If $Q_{MAX}$ and $Q'_{MAX}$ are partial discharges of different interstices, the back-end server displays the detection result and the operator performs redetection.

The robot body suspends the detection and raises an alarm through the back end server once the suspected heating defect area or the suspected discharge defect area is detected. Upon receiving the alarm, the operator remotely examines the detection pattern, makes a judgment, and determines whether to redetect the suspected defect area or to proceed with the detection of a next switch cabinet.

INDUSTRIAL APPLICABILITY

In the present application, a set of high-performance detectors are carried by a mobile motor-driven platform to implement automatic detection of partial discharge and infrared thermal images of the high-voltage switch cabinet without requiring the operator to be on site, greatly reducing the labor cost of live detection.

What is claimed is:

1. A live detection apparatus for a high-voltage switch cabinet, comprising a robot body and an in-station controlling terminal, wherein
the robot body comprises a host module, a power module, a detection module and a motion module, wherein the power module is electrically connected to the host module and the motion module, and the host module is communicably connected to the motion module and the detection module;
the detection module comprises a visible light camera, an infrared thermal imager, a non-contacting ultrasonic sensor and an ultrahigh-frequency sensor;
the motion module comprises a horizontal motion module, a vertical motion module and a rotating motion module, wherein the horizontal motion module comprises a motor-driven carrier and a laser navigation system, the vertical motion module is secured to the motor-driven carrier, the rotating motion module is secured to the vertical motion module, and the detection module is secured to the rotating motion module; and
the in-station controlling terminal is configured to:
acquire a preplanned detection path;
acquire a task package created according to a layout of switch cabinets, and mark positions of the switch cabinets and serial numbers of cabinet doors of the switch cabinets on a two-dimensional map according to the task package, wherein the two-dimensional map is pre-created according to a work environment; and
control the robot body of the live detection apparatus for a high-voltage switch cabinet to perform the following operations:
when acquiring a startup instruction remotely, the robot body of the live detection apparatus for a high-voltage switch cabinet starting off from a charging dock and moving along the detection path, and when the robot body arrives at a preset detection position of a first one of the switch cabinets, the robot body stopping moving and adjusting a carrier body and an angle of a detection system to enable a front end of the carrier body and the detection system to face the switch cabinet;
dividing the cabinet door of the switch cabinet into an upper section A and a lower section B, automatically turning on an infrared thermal imager, aiming the infrared thermal imager at the cabinet door horizontally, and taking a thermal image of the section A; and the detection module rotating vertically so that the infrared thermal imager is at an angle of 45 degrees to a horizontal plane, taking a thermal image of the section B, and then the detection module rotating back to a horizontal angle to complete infrared detection of the switch cabinet;
the robot body getting close to the cabinet door of the switch cabinet, and stopping moving when a laser radar in the laser navigation system detects that the cabinet door is ahead in a preset distance; starting the vertical motion module to raise the detection module at a constant speed, turning on the visible light camera to perform second detection and feature extraction of the switch cabinet, and the detection module stopping moving after detecting a door interstice of the switch cabinet; aiming the ultrahigh-frequency sensor and the non-contacting ultrasonic sensor at the door interstice to perform partial discharge detection; and continuing raising the detection module to detect a next door interstice, and, after the detection is completed, lowering the detection module to an original position, completing the partial discharge detection of the switch cabinet and obtaining a partial discharge detection pattern; and the robot body of the live detection apparatus for a high-voltage switch cabinet returning to the detection path, and moving to a next switch cabinet according to a marked positions of the switch cabinets on the map and detecting the next switch cabinet;

and the robot body automatically returning to the charging dock after all of the switch cabinets have been detected;

the in-station controlling terminal is further configured to control the robot body of the live detection apparatus for a high-voltage switch cabinet to perform the following operations:

after the obtaining the partial discharge detection pattern, comparing the partial discharge detection pattern with an original pattern, and if the partial discharge detection pattern of the non-contacting ultrasonic sensor or the ultrahigh-frequency sensor shows that an abnormal discharge signal exists in one interstice, continuing to detect a next interstice until no abnormal discharge signal is detected by both the non-contacting ultrasonic sensor and the ultrahigh-frequency sensor;

obtaining an ultrasonic signal amplitude number set and an ultrahigh-frequency signal peak number set according to a comparison between the partial discharge detection pattern and the original pattern for each interstice; and in response to determining that an interstice area corresponding to the maximum of the ultrasonic signal amplitude number set is the same as an interstice area corresponding to the maximum of the ultrahigh-frequency signal peak number set, determining the interstice area as a suspected discharge defect area, in response to determining that the interstice area corresponding to the maximum of the ultrasonic signal amplitude number set is different from the interstice area corresponding to the maximum of the ultrahigh-frequency signal peak number set, sending the detection result to a back-end server to display the detection result for an operator to perform redetection.

2. The live detection apparatus for a high-voltage switch cabinet according to claim 1, wherein the motor-driven carrier comprises two main front driving wheels, two main rear driving wheels, a drive motor, a drive gear and a rack, wherein the two main front driving wheels, the two rear driving wheels, the drive motor and the drive gear are secured to the rack.

3. The live detection apparatus for a high-voltage switch cabinet according to claim 1, wherein the host module is secured to the rack of the motor-driven carrier; the host module comprises a Wi-Fi communication module, an image processing module, a partial discharge signal processing module, a motion control system and a data acquisition system; and the motion control system is communicably connected to the motion module and the detection module, and the data acquisition system is communicably connected to the detection module.

4. The live detection apparatus for a high-voltage switch cabinet according to claim 1, further comprising: a remote controlling terminal, a mobile inquiry terminal and the back-end server, wherein the remote controlling terminal is connected to the in-station controlling terminal via an optical fiber, the mobile inquiry terminal is wirelessly connected to the in-station controlling terminal, and the robot body wirelessly communicates with the back-end server.

5. The live detection apparatus for a high-voltage switch cabinet according to claim 2, wherein the vertical motion module comprises: a linear actuator, a driver, a position encoder and a stopper, is secured to the rack of the motor-driven carrier and is electrically connected to the host module; the vertical motion module further comprises: a lifting rod, an air pump, an air cylinder, a coiling mechanism and a positioning mechanism; an adjustable height range of the vertical motion module is 50 cm~150 cm from the ground; the rotating motion module is a two-degree-of-freedom cradle head, is secured to the lifting rod of the vertical motion module and is electrically connected to the host module; and the rotating motion module comprises a drive motor, a rotating shaft and a circumferential positioning mechanism, and has a horizontal rotation angle of 0~360° and a vertical rotation angle of −60°~60°.

6. A live detection method for a high-voltage switch cabinet, applied to a live detection apparatus for a high-voltage switch cabinet; wherein the live detection apparatus for a high-voltage switch cabinet comprises a robot body and an in-station controlling terminal, wherein the robot body comprises a host module, a power module, a detection module and a motion module, wherein the power module is electrically connected to the host module and the motion module, and the host module is communicably connected to the motion module and the detection module; the detection module comprises a visible light camera, an infrared thermal imager, a non-contacting ultrasonic sensor and an ultrahigh-frequency sensor; the motion module comprises a horizontal motion module, a vertical motion module and a rotating motion module, wherein the horizontal motion module comprises a motor-driven carrier and a laser navigation system, the vertical motion module is secured to the motor-driven carrier, the rotating motion module is secured to the vertical motion module, and the detection module is secured to the rotating motion module; wherein the method comprises:

acquiring, by the in-station controlling terminal, a pre-planned detection path;

acquiring, by the in-station controlling terminal, a task package created according to a layout of switch cabinets, and marking, by the in-station controlling terminal, positions of the switch cabinets and serial numbers of cabinet doors of the switch cabinets on a two-dimensional map according to the task package, wherein the two-dimensional map is pre-created according to a work environment; and controlling, by the in-station controlling terminal, the robot body of the live detection apparatus for a high-voltage switch cabinet to perform the following operations:

when acquiring a startup instruction remotely, the robot body of the live detection apparatus for a high-voltage switch cabinet starting off from a charging dock and moving along the detection path, and when the robot body arrives at a preset detection position of a first one of the switch cabinets, the robot body stopping moving and adjusting a carrier body and an angle of a detection system to enable a front end of the carrier body and the detection system to face the switch cabinet;

dividing the cabinet door of the switch cabinet into an upper section A and a lower section B, automatically turning on an infrared thermal imager, aiming the infrared thermal imager at the cabinet door horizontally, and taking a thermal image of the section A; and the detection module rotating vertically so that the infrared thermal imager is at an angle of 45 degrees to a horizontal plane, taking a thermal image of the section B, and then the detection module rotating back to a horizontal angle to complete infrared detection of the switch cabinet;

the robot body getting close to the cabinet door of the switch cabinet, and stopping moving when a laser radar in the laser navigation system detects that the cabinet door is ahead in a preset distance; starting the vertical motion module to raise the detection module at a constant speed, turning on the visible light camera to perform second detection and feature extraction of the switch cabinet, and the detection module stopping moving after detecting a door interstice of the switch cabinet; aiming the ultrahigh-frequency sensor and the non-contacting ultrasonic sensor at the door interstice to perform partial discharge detection; and continuing raising the detection module to detect a next door interstice, and, after the detection is completed, lowering the detection module to an original position, completing the partial discharge detection of the switch cabinet and obtaining a partial discharge detection pattern; and the robot body of the live detection apparatus for a high-voltage switch cabinet returning to the detection path, and moving to a next switch cabinet according to a marked positions of the switch cabinets on the map and detecting the next switch cabinet;

and the robot body automatically returning to the charging dock after all of the switch cabinets have been detected;

after the obtaining the partial discharge detection pattern, the live detection method for a high-voltage switch cabinet further comprising:

the robot body of the live detection apparatus for a high-voltage switch cabinet comparing the partial discharge detection pattern with an original pattern, and if the partial discharge detection pattern of the non-contacting ultrasonic sensor or the ultrahigh-frequency sensor shows that an abnormal discharge signal exists in one interstice, the robot body continuing to detect a next interstice until no abnormal discharge signal is detected by both the non-contacting ultrasonic sensor and the ultrahigh-frequency sensor;

the robot body of the live detection apparatus for a high-voltage switch cabinet obtaining an ultrasonic signal amplitude number set and an ultrahigh-frequency signal peak number set according to a comparison between the partial discharge detection pattern and the original pattern for each interstice;

in response to determining that an interstice area corresponding to the maximum of the ultrasonic signal amplitude number set is the same as an interstice area corresponding to the maximum of the ultrahigh-frequency signal peak number set, the robot body of the live detection apparatus for a high-voltage switch cabinet determining the interstice area as a suspected discharge defect area, in response to determining that the interstice area corresponding to the maximum of the ultrasonic signal amplitude number set is different from the interstice area corresponding to the maximum of the ultrahigh-frequency signal peak number set, a back-end server displaying the detection result for an operator to perform redetection.

7. The live detection method for a high-voltage switch cabinet according to claim 6, wherein the acquiring, by the in-station controlling terminal, the preplanned detection path comprises: operating the robot body of the live detection apparatus for a high-voltage switch cabinet to automatically traverse the whole work environment and create the two-dimensional map using the laser navigation system when the robot body traverses the whole work environment; and planning the detection path on the two-dimensional map according to the two-dimensional map.

8. The live detection method for a high-voltage switch cabinet according to claim 6, wherein the acquiring, by the in-station controlling terminal, the task package created according to the layout of switch cabinets, and marking, by the in-station controlling terminal, positions of the switch cabinets and serial numbers of cabinet doors of the switch cabinets on the two-dimensional map according to the task package comprises: downloading, by the in-station controlling terminal, the task package, processing the pre-created two-dimensional map using the layout of switch cabinets in the task package and marking, by the in-station controlling terminal, the positions of switch cabinets and the serial numbers of the cabinet doors of the switch cabinets on the two-dimensional map.

9. The live detection method for a high-voltage switch cabinet according to claim 6, after completing the infrared detection of the switch cabinet, further comprising: the robot body of the live detection apparatus for a high-voltage switch cabinet comparing the thermal image with an original thermal image during the detection; and if an abnormal temperature rise is detected in one area, the robot body of the live detection apparatus for a high-voltage switch cabinet continuing to detect a next area until no abnormal temperature is detected in a detection area;

the robot body of the live detection apparatus for a high-voltage switch cabinet obtaining a temperature rise number set of a heating area according to a comparison between the thermal image and the original thermal image in each detection area; and the robot body of the live detection apparatus for a high-voltage switch cabinet finding out a suspected heating defect area according to the temperature rise number set of the heating area using a horizontal comparison method.

10. The live detection method for a high-voltage switch cabinet according to claim 9, after the finding out the suspected heating defect area, further comprising:

the robot body of the live detection apparatus for a high-voltage switch cabinet stopping detection and raising an alarm.

11. The live detection method for a high-voltage switch cabinet according to claim 6, after the finding out the suspected discharge defect area, further comprising:

the robot body of the live detection apparatus for a high-voltage switch cabinet stopping detection and raising an alarm.

* * * * *